(12) United States Patent
Inada et al.

(10) Patent No.: US 10,923,368 B2
(45) Date of Patent: Feb. 16, 2021

(54) SUBSTRATE PROCESSING APPARATUS, SUBSTRATE PROCESSING METHOD, AND STORAGE MEDIUM

(71) Applicant: Tokyo Electron Limited, Tokyo (JP)

(72) Inventors: Takao Inada, Kumamoto (JP); Hisashi Kawano, Kumamoto (JP); Hiroki Ohno, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/164,919

(22) Filed: Oct. 19, 2018

(65) Prior Publication Data

US 2019/0148183 A1    May 16, 2019

(30) Foreign Application Priority Data

Oct. 20, 2017   (JP) ................... 2017-203724

(51) Int. Cl.
*H01L 21/67*        (2006.01)
*H01L 21/66*        (2006.01)
*H01L 21/311*       (2006.01)

(52) U.S. Cl.
CPC .. *H01L 21/67086* (2013.01); *H01L 21/31111* (2013.01); *H01L 21/67017* (2013.01); *H01L 21/67248* (2013.01); *H01L 21/67253* (2013.01); *H01L 22/26* (2013.01)

(58) Field of Classification Search
USPC .................................................. 156/345.15
See application file for complete search history.

(56) References Cited

U.S. PATENT DOCUMENTS

| | | | | |
|---|---|---|---|---|
| 2004/0157452 A1* | 8/2004 | Ogawa | ............... | H01L 21/31111 438/691 |
| 2008/0179293 A1* | 7/2008 | Wei | ................... | H01L 21/31111 216/84 |
| 2009/0087929 A1* | 4/2009 | Yu | .................... | H01L 21/67086 438/8 |
| 2013/0240143 A1* | 9/2013 | Kiyose | .................. | B44C 1/227 156/345.15 |
| 2013/0255882 A1* | 10/2013 | Takahashi | ......... | H01L 21/30604 156/345.15 |
| 2016/0233106 A1* | 8/2016 | Furukawa | ......... | H01L 21/31111 |
| 2017/0062231 A1* | 3/2017 | Sato | .................. | H01L 21/67086 |
| 2017/0309501 A1* | 10/2017 | Kitamura | .......... | H01L 21/31111 |

FOREIGN PATENT DOCUMENTS

JP        2013-232593 A     11/2013

* cited by examiner

*Primary Examiner* — Ram N Kackar
(74) *Attorney, Agent, or Firm* — Abelman, Frayne & Schwab

(57) ABSTRACT

A substrate processing apparatus according to an embodiment includes a substrate processing tank, a temperature adjustment unit, and a controller. The substrate processing tank is configured to perform an etching processing by immersing a substrate in a phosphoric acid processing liquid therein. The temperature adjustment unit is configured to adjust the temperature of the phosphoric acid processing liquid. The controller is configured to control the temperature adjustment unit to lower the temperature of the phosphoric acid processing liquid as the etching processing proceeds.

13 Claims, 9 Drawing Sheets

SUBSTRATE PROCESSING APPARATUS, SUBSTRATE PROCESSING METHOD, AND STORAGE MEDIUM

CROSS-REFERENCE TO RELATED APPLICATIONS

This application is based on and claims priority from Japanese Patent Application No. 2017-203724, filed on Oct. 20, 2017, with the Japan Patent Office, the disclosure of which is incorporated herein in its entirety by reference.

TECHNICAL FIELD

Exemplary embodiments disclosed herein relate to a substrate processing apparatus, a substrate processing method, and a storage medium.

BACKGROUND

In the related art, it has been known to carry out an etching processing which, among a silicon nitride film (SiN) and a silicon oxide film ($SiO_2$) formed on a substrate, selectively etches the silicon nitride film by immersing the substrate in a phosphoric acid processing liquid in a substrate processing apparatus (see, e.g., Japanese Patent Laid-Open Publication No. 2013-232593).

SUMMARY

A substrate processing apparatus according to an aspect of an embodiment includes a substrate processing tank, a temperature adjustment unit, and a controller. The substrate processing tank is configured to perform an etching processing by immersing a substrate in a phosphoric acid processing liquid therein. The temperature adjustment unit is configured to adjust a temperature of the phosphoric acid processing liquid. As the etching processing proceeds, the controller controls the temperature adjustment unit to lower the temperature of the phosphoric acid processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
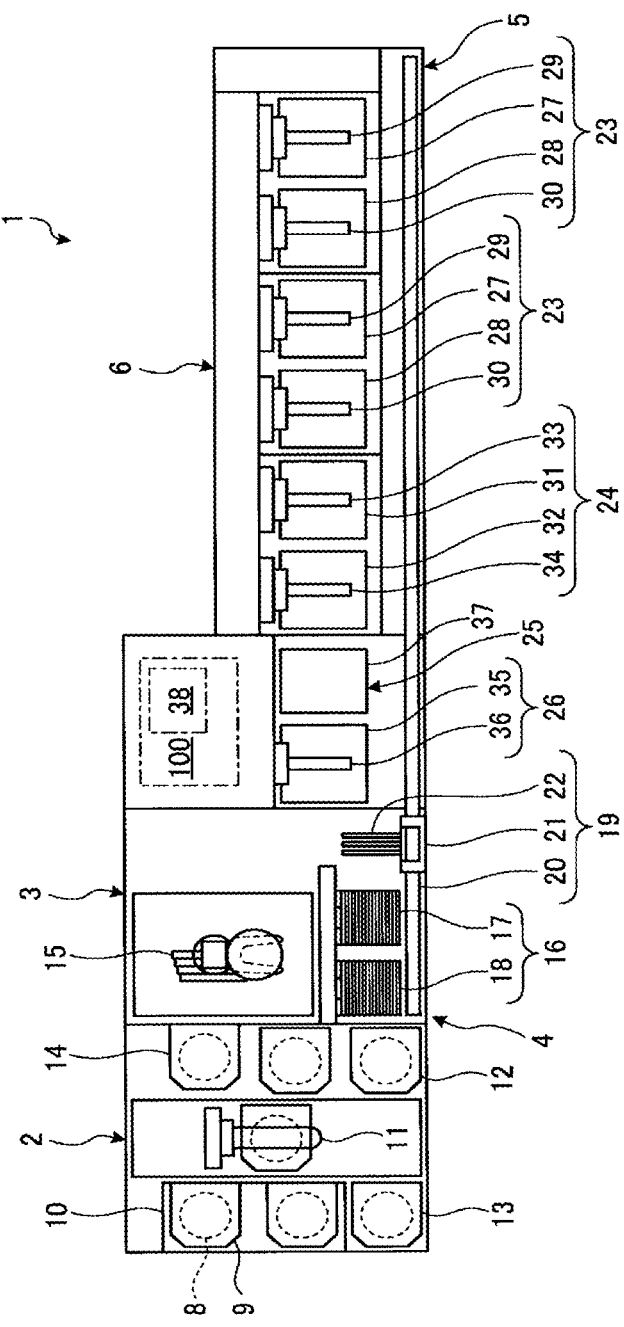
FIG. 1 is a schematic plan view illustrating a substrate processing apparatus.

In the following detailed description, reference is made to the accompanying drawings, which form a part of the present disclosure. The illustrative embodiments described in the detailed description, drawing, and claims are not meant to be in any way limiting. Other embodiments may be utilized, and other changes may be made without departing from the spirit or the scope of the subject matter presented here.

When the silicon nitride film is selectively etched in a substrate in which a plurality of silicon nitride films and silicon oxide films are laminated, as the etching proceeds, the path of discharging the components of the etched silicon nitride film to the outside of the substrate becomes longer. Thus, the concentration of silicon in the phosphoric acid processing liquid in the gaps formed between the silicon oxide films increases, and the silicon oxide may be precipitated on the silicon oxide films.

An aspect of an embodiment is to provide a substrate processing apparatus, a substrate processing method, and a storage medium that suppress the precipitation of silicon oxide.

A substrate processing apparatus according to an aspect of an embodiment includes a substrate processing tank, a temperature adjustment unit, and a controller. The substrate processing tank is configured to perform an etching processing by immersing a substrate in a phosphoric acid processing liquid therein. The temperature adjustment unit is configured to adjust a temperature of the phosphoric acid processing liquid. As the etching processing proceeds, the controller controls the temperature adjustment unit to lower the temperature of the phosphoric acid processing liquid.

In the above-described substrate processing apparatus, the controller is configured to control the temperature adjustment unit to raise the temperature of the phosphoric acid processing liquid after lowering the temperature of the phosphoric acid processing liquid to a processing termination temperature.

The above-described substrate processing apparatus further includes a phosphoric acid concentration adjustment unit configured to adjust a phosphoric acid concentration in the phosphoric acid processing liquid. The controller is configured to control the phosphoric acid concentration adjustment unit to lower the phosphoric acid concentration as the etching processing proceeds.

In the above-described substrate processing apparatus, the controller is configured to control the phosphoric acid concentration adjustment unit to increase the phosphoric acid concentration after lowering the phosphoric acid concentration of the phosphoric acid processing liquid to a processing termination phosphoric acid concentration.

The above-described substrate processing apparatus further includes a silicon concentration adjustment unit configured to adjust a silicon concentration in the phosphoric acid processing liquid. The controller is configured to control the silicon concentration adjustment unit to lower the silicon concentration as the etching processing proceeds.

In the above-described substrate processing apparatus, the controller is configured to control the silicon concentration adjustment unit to increase the silicon concentration after lowering the silicon concentration of the phosphoric acid processing liquid to a processing termination silicon concentration.

A substrate processing method according to an aspect of an embodiment includes performing an etching processing by immersing a substrate in a phosphoric acid processing liquid; and lowering a temperature of the phosphoric acid processing liquid as the etching processing proceeds.

A non-transitory computer-readable storage medium according to an aspect of an embodiment stores a program for causing a computer to execute the above-described substrate processing method.

According to an aspect of an embodiment, it is possible to prevent precipitation of silicon oxide.

Hereinafter, embodiments of a substrate processing apparatus, a substrate processing method, and a storage medium disclosed herein will be described in detail with reference to the accompanying drawings. However, the present disclosure is not limited by the embodiments described below.

As illustrated in FIG. 1, a substrate processing apparatus 1 according to an embodiment includes a carrier carry-in/out section 2, a lot forming section 3, a lot placing section 4, a lot transport section 5, a lot processing section 6, and a controller 100. FIG. 1 is a schematic plan view illustrating the substrate processing apparatus 1. Here, a direction orthogonal to a horizontal direction will be described as a vertical direction.

The carrier carry-in/out section 2 is configured to perform carry-in/out of a carrier 9 containing a plurality of (e.g., 25) substrates (silicon wafers) 8 aligned vertically in a horizontal posture.

The carrier carry-in/out section 2 is provided with a carrier stage 10 on which a plurality of carriers 9 are placed, a carrier transport mechanism 11 configured to transport the carriers 9, carrier stocks 12, 13 configured to temporarily store the carriers 9 therein, and a carrier placing table 14 configured to place a carrier 9 thereon.

The carrier carry-in/out section 2 is configured to transport a carrier 9 carried from the outside into the carrier stage 10 to the carrier stock 12 or the carrier placing table 14 using the carrier transport mechanism 11. That is, the carrier carry-in/out unit 2 transports a carrier 9 containing a plurality of substrates 8 before processing in the lot processing section 6 to the carrier stock 12 or the carrier placing table 14.

The carrier stock 12 temporarily stores the carrier 9 containing the plurality of substrates 8 before processing in the lot processing section 6.

From the carrier 9 transported to the carrier placing table 14 and containing the plurality of substrates 8 before processing in the lot processing section 6, the plurality of substrates 8 are carried out by a substrate transport mechanism 15 which will be described later.

In addition, a plurality of substrates 8 processed in the lot processing section 6 are carried into a carrier 9 placed on the carrier placing table 14 and containing no substrate 8 from the substrate transport mechanism 15.

The carrier carry-in/out section 2 is configured to transport the carrier 9 placed on the carrier placing table 14 and containing the plurality of substrates 8 after processing in the lot processing section 6 to the carrier stock 13 or the carrier stage 10 using the carrier transport mechanism 11.

The carrier stock 13 temporarily stores the plurality of substrates 8 after processing in the lot processing section 6. The carrier 9 transported to the carrier stage 10 is carried out to the outside.

The lot forming section 3 is provided with the substrate transport mechanism 15 configured to transport a plurality of (e.g., 25) substrates 8. In the lot forming section 3, a plurality of (e.g., 25) substrates 8 are transported twice by the substrate transport mechanism 15 and a lot composed of a plurality of substrates (e.g., 50) of substrates 8 is formed.

In the lot forming section 3, a plurality of substrates 8 are from the carrier 9 placed on the carrier placing table 14 to the lot placing section 4 using the substrate transport mechanism 15, and the plurality of substrates 8 are placed in the lot placing section 4 so as to form a lot.

The plurality of substrates 8 forming the lot are simultaneously processed by the lot processing section 6. When forming a lot, the lot may be formed such that the pattern-formed surfaces of a plurality of substrates 8 face each other, or may be formed such that all the pattern-formed surfaces of a plurality of substrates 8 are oriented in one direction.

In addition, in the lot forming section 3, a plurality of substrates 8 are transported from a lot 4 processed in the lot processing section 6 and placed in the lot placing section 4 to a carrier 9 using the substrate transport mechanism 15.

The substrate transport mechanism 15 includes two kinds of substrate support units configured to a plurality of substrates 8, that is, a pre-processing substrate support unit (not illustrated) configured to support a plurality of substrates 8 before processing and a post-processing substrate support unit (not illustrated) configured to support a plurality of substrates 8 after processing. This makes it possible to prevent particles attached to the plurality of substrates 8 before processing from being transferred to a plurality of substrates 8 after processing.

The substrate transport mechanism 15 changes the posture of the plurality of substrates 8 from the horizontal posture to the vertical posture and from the vertical posture to the horizontal posture in the middle of transport of the plurality of substrates 8.

In the lot placing section 4, a lot transported between the lot forming section 3 and the lot processing section 6 by the lot transport section 5 is temporarily placed (stands by) on a lot placing table 16.

In the lot placing section 4, a carry-in side lot placing table 17 and a carry-out side lot placing table 18 are provided.

On the carry-in side lot placing table 17, a lot before processing is placed. On the carry-out side lot placing table 18, a lot after processing is placed.

A plurality of substrates 8 for one lot are placed side by side in the vertical posture and in the front and rear on each of the carry-in side lot placing table 17 and the carry-out side lot placing table 18.

The lot transport section 5 transports lots between the lot placing section 4 and the lot processing section 6 or between the internal portions the lot processing section 6.

The lot transport section 5 is provided with a lot transport mechanism 19 configured to transport a lot. The lot transport mechanism 19 includes a rail 20 disposed along the lot placing section 4 and the lot processing section 6 and a moving body 21 configured to move along the rail 20 while holding a lot.

The moving body 21 is provided with a substrate holder 22 configured to hold a lot formed of a plurality of substrates 8 arranged in the front and rear in a vertical attitude.

The lot transport section 5 receives a lot placed on the carry-in side lot placing table 17 with the substrate holder 22 of the lot transport mechanism 19, and delivers the received lot to the lot processing section 6.

In addition, the lot transport section 5 receives a lot processed in the lot processing section 6 with the substrate holder 22 of the lot transport mechanism 19, and delivers the received lot to the carry-out side lot placing table 18.

Further, the lot transport section 5 transports the lot within the lot processing section 6 using the lot transport mechanism 19.

The lot processing section 6 performs processings such as, for example, etching, cleaning, and drying on a lot formed of a plurality of substrates 8 arranged in the front and rear in a vertical attitude.

The lot processing section 6 includes two etching processing apparatuses 23 configured to perform an etching processing on the lot, a cleaning processing apparatus 24 configured to perform a cleaning processing on the lot, a substrate holder cleaning processing apparatus 25 configured to perform a cleaning processing on the substrate holder 22, and a drying processing apparatus 26 configured to perform a drying processing on the lot, which are provided side by side. In addition, the number of etching processing apparatuses 23 may be one or three or more without being limited to two.

The etching processing apparatus includes an etching processing tank 27, a rinsing processing tank 28, and substrate lifting mechanisms 29, 30.

A processing liquid for etching (hereinafter, referred to as "etching liquid") is stored in the etching processing tank 27. In the rinsing processing tank 28, a processing liquid for rinsing (e.g., pure water) is stored. Details of the etching processing tank 27 will be described later.

In the substrate lifting mechanisms 29, 30, a plurality of substrates 8 forming a lot are aligned and held in the front and rear in a vertical posture.

The etching processing apparatus 23 receives a lot from the substrate holder 22 of the lot transport mechanism 19 with the substrate lifting mechanism 29 and lowers the received lot by the substrate lifting mechanism 29 so as to immerse the lot in the etching liquid of the processing tank 27, thereby performing an etching processing. The etching processing is performed, for example, for about 1 hour to 2 hours.

Thereafter, the etching processing apparatus 23 takes out the lot from the processing tank 27 by raising the substrate lifting mechanism 29, and delivers the lot from the substrate lifting mechanism 29 to the substrate holder 22 of the lot transport mechanism 19.

Then, the etching processing apparatus 23 receives the lot from the substrate holder 22 of the lot transport mechanism 19 with the substrate lifting mechanism 30 and lowers the received lot by the substrate lifting mechanism 29 so as to immerse the lot in the processing liquid for rinsing in the processing tank 28, thereby performing a rinsing processing.

Thereafter, the etching processing apparatus 23 takes out the lot from the processing tank 28 by raising the substrate lifting mechanism 30, and delivers the lot from the substrate lifting mechanism 30 to the substrate holder 22 of the lot transport mechanism 19.

The cleaning processing apparatus 24 includes a cleaning processing tank 31, a rinsing processing tank 32, and substrate lifting mechanisms 33, 34.

In the cleaning processing tank 31, a processing liquid for cleaning (e.g., SC-1) is stored. In the rinsing processing tank 32, a processing liquid for rinsing (e.g., pure water) is stored. In the substrate lifting mechanisms 33, 34, a plurality of substrates 8 forming a lot are aligned and held in the front and rear in a vertical posture.

The drying processing apparatus 26 has a processing tank 35 and a substrate lifting mechanism 36 configured to move up and down with respect to the processing tank 35.

A processing gas for drying (e.g., isopropyl alcohol (IPA)) is supplied to the processing tank 35. In the substrate lifting mechanism 36, a plurality of substrates 8 for one lot are aligned and held in the front and rear in a vertical posture.

The drying processing apparatus 26 receives a lot from the substrate holder 22 of the lot transport mechanism 19 with the substrate lifting mechanism 36, lowers the received lot by the substrate lifting mechanism 36 so as to carry the lot into the processing tank 35, and performs the drying processing on the lot with the processing gas for drying supplied to the processing tank 35. Then, the drying processing apparatus 26 raises the lot by the substrate lifting mechanism 36, and delivers the lot subjected to the drying processing from the substrate lifting mechanism 36 to the substrate holder 22 of the lot transport mechanism 19.

The substrate holder cleaning processing apparatus 25 is configured to be able to supply a processing liquid for cleaning and a drying gas to the processing tank 37. After supplying the processing liquid for cleaning to the substrate holder 22 of the lot transport mechanism 19, the cleaning processing of the substrate holder 22 is performed by supplying the drying gas.

Figure 2:
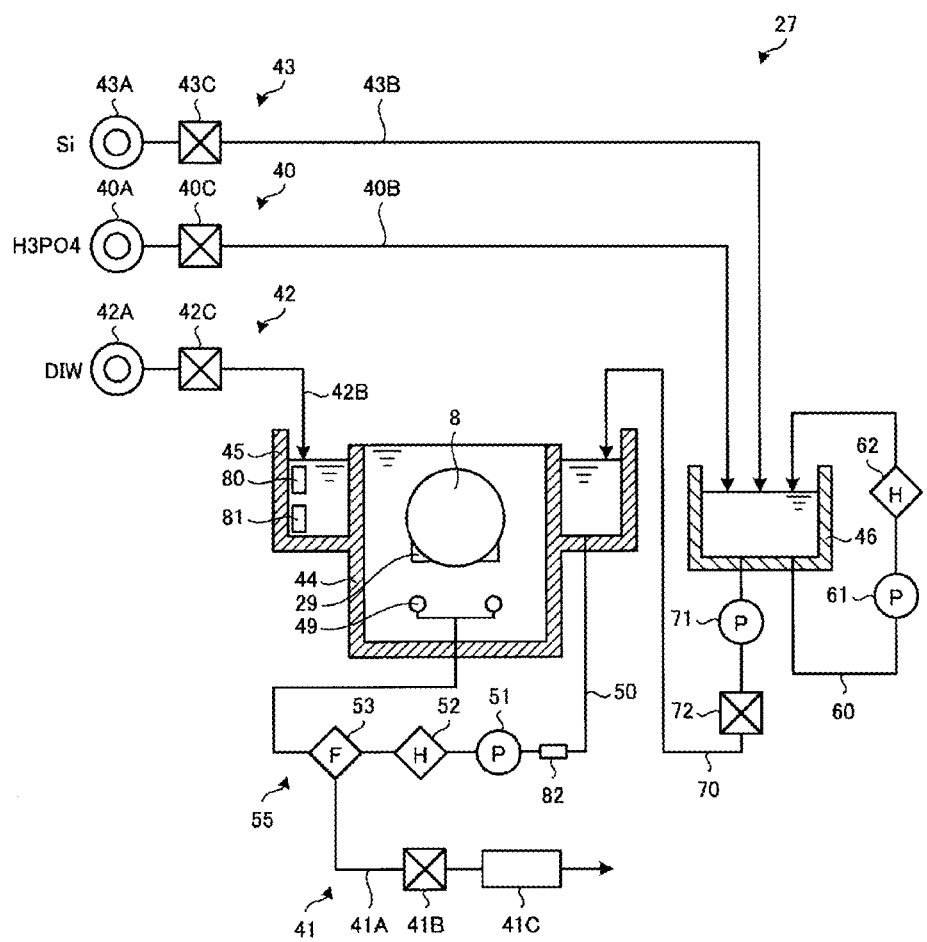
FIG. 2 is a schematic block diagram illustrating a configuration of an etching processing tank according to an embodiment.

Next, the etching processing tank 27 will be described with reference to FIG. 2. FIG. 2 is a schematic block diagram illustrating the configuration of the etching processing tank 27 according to an embodiment.

In the etching processing tank, among a silicon nitride film (SiN) 8A (see, e.g., FIG. 3A) and a silicon oxide film ($SiO_2$) 8B (see, e.g., FIG. 3A) formed on a substrate 8 in the etching processing tank 27, only the silicon nitride film 8A is selectively etched.

In the etching processing of the nitride film, a solution in which a silicon concentration is adjusted by adding a silicon (Si)-containing compound to a phosphoric acid ($H_3PO_4$) aqueous solution is generally used as an etching liquid. As a method of adjusting the silicon concentration, there are a method in which silicon is dissolved by immersing a dummy substrate in an existing phosphoric acid aqueous solution (seasoning) and a method in which a silicon-containing compound such as, for example, colloidal silica is dissolved in a phosphoric acid aqueous solution. There is also a method of adjusting the silicon concentration by adding a silicon-containing compound aqueous solution to a phosphoric acid aqueous solution.

The etching tank 27 includes a phosphoric acid aqueous solution supply section 40, a phosphoric acid aqueous solution discharge section 41, a pure water supply section 42, a silicon supply section 43, an inner tank 44, an outer tank 45, a temperature control tank 46.

The phosphoric acid aqueous solution supply section 40 includes a phosphoric acid aqueous solution supply source 40A, a phosphoric acid aqueous solution supply line 40B, and a first flow rate regulator 40C.

The phosphoric acid aqueous solution supply source 40A is a tank for storing the phosphoric acid aqueous solution. The phosphoric acid aqueous solution supply line 40B connects the phosphoric acid aqueous solution supply source 40A and the temperature control tank 46 so as to supply the phosphoric acid aqueous solution from the phosphoric acid aqueous solution supply source 40A to the temperature control tank 46.

The first flow rate regulator 40C is provided in the phosphoric acid aqueous solution supply line 40B so as to adjust the supply amount of the phosphoric acid aqueous solution supplied to the temperature control tank 46. The first flow rate regulator 40C includes, for example, an opening/closing valve, a flow rate control valve, and a flow meter.

The pure water supply section 42 includes a pure water supply source 42A, a pure water supply line 42B, and a second flow rate regulator 42C. The pure water supply section 42 supplies deionized water (DIW) to the outer tank 45 in order to replenish water evaporated by heating the etching liquid.

The pure water supply line 42B connects the pure water supply source 42A and the outer tank 45 so as to supply pure water having a predetermined temperature from the pure water supply source 42A to the outer tank 45.

The second flow rate regulator 42C is provided in the pure water supply line 42B so as to adjust the supply amount of pure water to be supplied to the outer tank 45. The second flow rate regulator 42C includes, for example, an opening/closing valve, a flow rate control valve, and a flow meter. By adjusting the supply amount of pure water by the second flow rate regulator 42C, the temperature of the etching liquid, the phosphoric acid concentration, and the silicon concentration are adjusted. The second flow rate regulator 42C constitutes a temperature adjustment unit, a phosphoric acid concentration adjustment unit, and a silicon concentration adjustment unit.

The silicon supply section 43 includes a silicon supply source 43A, a silicon supply line 43B, and a third flow rate regulator 43C.

The silicon supply source 43A is a tank that stores a silicon-containing compound aqueous solution. The silicon supply line 43B connects the silicon supply source 43A and the temperature control tank 46 to each other so as to supply the silicon-containing compound aqueous solution from the silicon supply source 43A to the temperature control tank 46.

The third flow rate regulator 43C is provided in the silicon supply line 43B so as to adjust the supply amount of the silicon-containing compound aqueous solution supplied to the temperature control tank 46. The third flow rate regulator 43C includes, for example, an opening/closing valve, a flow rate control valve, and a flow meter.

The silicon-containing compound aqueous solution is supplied in the case where a reserve liquid to be supplied is generated when the etching processing is completed and all the etching liquid is exchanged. In addition, the silicon supply section 43 may be configured to be capable of supplying the silicon-containing compound aqueous solution to the outer tank 45. In this case, the silicon supply section 43 may supply the silicon-containing compound aqueous solution to the outer tank 45 when the silicon concentration in the etching liquid decreases during the etching processing.

The upper portion of the inner tank 44 is opened, and the etching liquid is supplied to the vicinity of the upper portion. In the inner tank 44, a lot (a plurality of substrates 8) is immersed in the etching liquid by the substrate lifting mechanism 29, and thus the substrates 8 are etched. The inner tank 44 constitutes a substrate processing tank.

The outer tank 45 is provided around the upper portion of the inner tank 44 and the upper portion thereof is opened. The etching liquid overflowing from the inner bath 44 flows into the outer tank 45. In addition, the reserve liquid is supplied to the outer tank 45 from the temperature control tank 46. Further, pure water is supplied to the outer tank 45 from the pure water supply section 42.

The outer tank 45 is provided with a temperature sensor 80 configured to detect the temperature of the etching liquid and a phosphoric acid concentration sensor 81 configured to detect the phosphoric acid concentration of the etching liquid. Signals generated by the sensors 80, 81 are input to the controller 100 (see, e.g., FIG. 1).

The outer tank 45 and the inner tank 44 are connected by a first circulation line 50. One end of the first circulation line 50 is connected to the outer tank 45, and the other end of the first circulation line 50 is connected to a processing liquid supply nozzle 49 provided in the inner tank 44.

The first circulation line 50 is provided with a first pump 51, a first heater 52, and a filter 53 in order from the outer tank 45 side. The etching liquid in the outer tank 45 is heated by the first heater 52 and flows into the inner tank 44 from the processing liquid supply nozzle 49. The first heater 52 controls the temperature of the etching liquid supplied to the inner tank 44. In addition, the first circulation line 50 is provided with a silicon concentration sensor 82 configured to detect the silicon concentration of the etching liquid. A signal generated by the silicon concentration sensor 82 is input to the controller 100. The first heater 52 constitutes a temperature adjustment unit.

By driving the first pump 51, the etching liquid is sent from the outer tank 45 to the inner tank 44 via the first circulation line 50. In addition, the etching liquid flows out to the outer tank 45 again by overflowing from the inner tank 44. In this way, an etching liquid circulation path 55 is formed. That is, the circulation path 55 is formed by the outer tank 45, the first circulation line 50, and the inner tank 44. In the circulation path 55, the outer tank 45 is provided on the upstream side of the first heater 52 with reference to the inner tank 44.

In the temperature control tank 46, the phosphoric acid aqueous solution supplied from the phosphoric acid aqueous solution supply unit 40 is stored as a reserve liquid. In addition, in the temperature control tank 46, a reserve liquid in which the phosphoric acid aqueous solution supplied from the phosphoric acid aqueous solution supply unit 40 and the silicon-containing compound aqueous solution supplied from the silicon supply unit 43 are mixed is generated and stored.

For example, in the temperature control tank 46, when replacing all the etching liquid in the inner tank 44 and the outer tank 45, the reserve liquid in which the phosphoric acid aqueous solution and the silicon-containing compound aqueous solution are mixed is generated and stored. In the temperature control tank 46, when a part of the etching liquid is replaced during the etching processing, the phosphoric acid aqueous solution is stored as the reserve liquid.

A second circulation line 60 is connected to the temperature control tank 46 so as to circulate the reserve liquid in the temperature control tank 46. Further, one end of the supply line 70 is connected to the temperature control tank 46. The other end of the supply line 70 is connected to the outer tank 45.

The second circulation line 60 is provided with a second pump 61 and a second heater 62. By driving the second pump 61 in the state in which the second heater 62 is turned on, the reserve liquid in the temperature control tank 46 is heated and circulated. The second heater 62 controls the temperature of the reserve liquid. The second heater 62 constitutes a temperature adjustment unit.

The supply line 70 is provided with a third pump 71 and a fourth flow rate regulator 72. The fourth flow rate regulator 72 adjusts the supply amount of the reserve liquid supplied to the outer tank 45. The fourth flow rate regulator 72 includes, for example, an opening/closing valve, a flow rate control valve, and a flow meter. By adjusting the supply amount of the reserve liquid by the fourth flow rate regulator 72, the temperature of the etching liquid, the phosphoric acid concentration, and the silicon concentration are adjusted. The fourth flow rate regulator 72 constitutes a temperature adjustment unit, a phosphoric acid concentration adjustment unit, and a silicon concentration adjustment unit.

The reserve liquid stored in the temperature control tank 46 is supplied to the outer tank 45 via the supply line 70 when all or a part of the etching liquid is exchanged.

The phosphoric acid aqueous solution discharging section 41 discharges the etching liquid when all or a part of the etching liquid used in the etching processing is exchanged. The phosphoric acid aqueous solution discharge section 41 has a discharge line 41A, a fifth flow rate regulator 41B, and a cooling tank 41C.

The discharge line 41A is connected to the first circulation line 50. The fifth flow rate regulator 41B is provided in the discharge line 41A so as to adjust the discharge amount of the discharged etching liquid. The fifth flow rate regulator 41B includes, for example, an opening/closing valve, a flow rate control valve, and a flow meter. The cooling tank 41C temporarily stores and cools the etching liquid flowing thereinto through the discharge line 41A. The discharge amount is adjusted by the fifth flow rate regulator 41B, and for example, the temperature of the etching liquid, the phosphoric acid concentration, and the silicon concentration are adjusted by supplying pure water. The fifth flow rate regulator 41B constitutes a temperature adjustment unit, a phosphoric acid concentration adjustment unit, and a silicon concentration adjustment unit.

In addition, the opening/closing of the opening/closing valves constituting the first flow rate regulator 40C to the fifth flow rate regulator 41B and the opening degrees of the flow rate control valves constituting the first flow rate regulator 40C to the fifth flow rate regulator 41B are changed when an actuator (not illustrated) operates based on a signal from the controller 100. That is, the opening/closing valves and the flow rate control valves that constitute the first flow rate regulator 40C to the fifth flow rate regulator 41B are controlled by the controller 100.

Returning back to FIG. 1, the controller 100 controls the operations of respective sections (the carrier carry-in/carry-out section 2, the lot forming section 3, the lot placing section 4, the lot transport section 5, the lot processing section 6) of the substrate processing apparatus 1. The controller 100 controls the operations of respective sections of the substrate processing apparatus 1 based on signals from, for example, a switch.

The controller 100 is configured with, for example, a computer, and has a computer-readable storage medium 38. In the storage medium 38, a program for controlling various processings executed in the substrate processing apparatus 1 is stored.

The controller 100 controls the operations of the substrate processing apparatus 1 by reading and executing the program stored in the storage medium 38. In addition, the program may have been stored in the computer-readable storage medium 38 and may have been installed from another storage medium to the storage medium 38 of the controller 100.

The computer-readable storage medium 38 includes, for example, a hard disk (HD), a flexible disk (FD), a compact disk (CD), a magneto optical disk (MO), and a memory card.

Figure 3A:
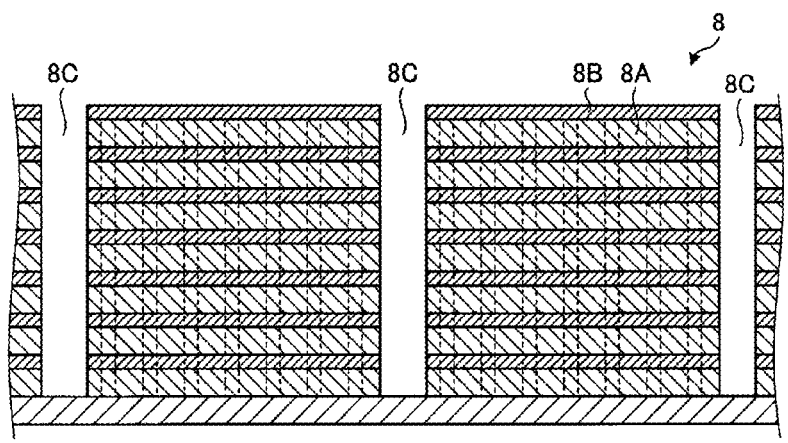
FIG. 3A is a schematic view illustrating a cross section of a substrate before performing an etching processing.
Figure 3B:
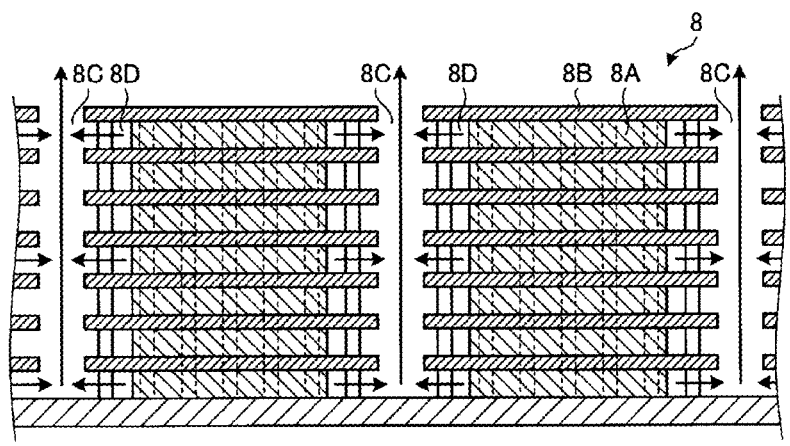
FIG. 3B is a schematic view illustrating the state of the substrate on which the etching processing has proceeded.
Figure 3C:
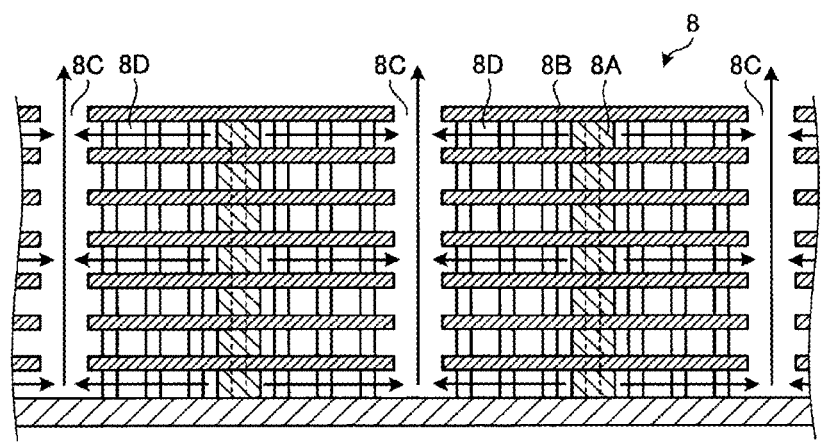
FIG. 3C is a schematic view showing the state of the substrate on which the etching processing has further proceeded.
Figure 3D:
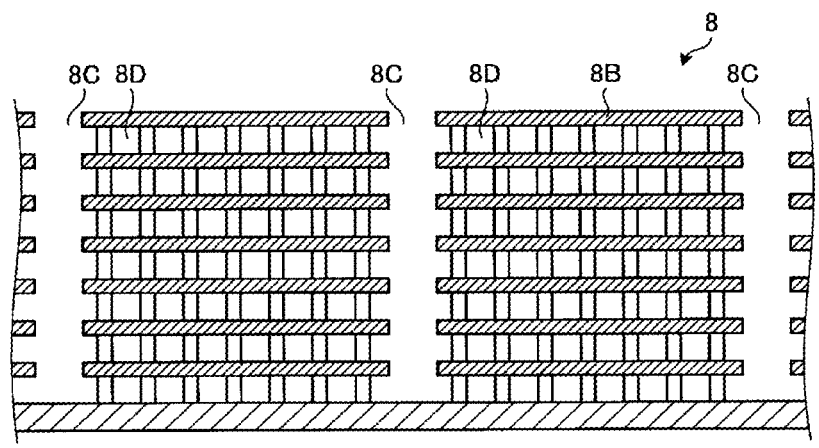
FIG. 3D is a schematic view illustrating the state of the substrate on which the etching processing has been terminated.

Here, the etching processing will be described with reference to FIGS. 3A to 3D. FIG. 3A is a schematic view illustrating a cross section of a substrate 8 before performing an etching processing. FIG. 3B is a schematic view illustrating the state of the substrate 8 on which the etching processing has proceeded. FIG. 3C is a schematic view illustrating the state of the substrate 8 on which the etching processing has further proceeded. FIG. 3D is a schematic diagram illustrating the state of the substrate 8 on which the etching processing has been terminated.

As illustrated in FIG. 3A, a plurality of silicon nitride films 8A and silicon oxide films 8B are alternately laminated on a substrate 8 before performing an etching processing. In addition, a plurality of grooves 8C for etching the laminated silicon nitride films 8A are formed in the substrate 8 by the infiltration of an etching liquid.

When the substrate 8 is immersed in the inner tank 44 and the etching processing is started, as illustrated in FIG. 3B, first, the silicon nitride films 8A in the vicinity of the grooves 8C are etched. That is, in the etching processing, etching is sequentially performed from the silicon nitride films 8A closer to the grooves 8C.

The components of the silicon nitride films 8A eluted into the etching liquid by etching are discharged from gaps 8D formed by etching the silicon nitride films 8A into the grooves 8C and discharged from the grooves 8C to the outside of the substrate 8. The etching proceeds since the etching liquid in the grooves 8C and the gaps 8D is replaced with a new etching liquid.

Therefore, as the etching processing proceeds, the distance from the etched portions to the grooves 8C is increased as illustrated in FIG. 3C. That is, the distance through which the components of the silicon nitride films 8A eluted into the etching liquid are discharged to the outside of the substrate 8 is increased.

Therefore, when the etching rate of the silicon nitride films 8A is great, the concentration of silicon contained in the etching liquid in the grooves 8C and the gaps 8D becomes high. Particularly, in the gaps 8D formed at the inner portions of the grooves 8C, that is, at positions where the distance from the surface of the substrate 8 is long, the silicon concentration of the etching liquid becomes high.

Therefore, the silicon oxide may be precipitated on the silicon oxide films while the etching liquid containing the components of the etched and eluted silicon nitride films 8A is discharged to the outside of the substrate 8.

In addition, when the etching processing further proceeds, the gaps 8D on both sides are communicated with each other as illustrated in FIG. 3D.

In the substrate processing apparatus 1 according to the present embodiment, the etching processing is performed by a method described below.

Figure 4:
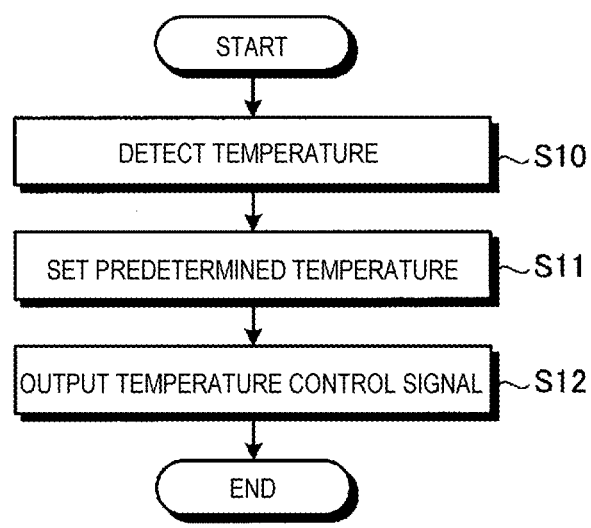
FIG. 4 is a flowchart illustrating a temperature control in an etching processing.

First, the temperature control of the etching processing tank 27 will be described with reference to FIG. 4. FIG. 4 is a flowchart illustrating a temperature control in an etching processing.

When starting the etching processing, the temperature of the etching liquid is a pre-set initial temperature. The initial temperature is a temperature at which the etching liquid becomes a boiling state.

When the controller 100 starts the etching processing, the temperature of the etching liquid is detected by the temperature sensor 80 (S10).

The controller 100 sets the set temperature of the etching liquid to a predetermined temperature based on the processing time of the etching processing (S11). Specifically, the controller 100 sets the predetermined temperature to a lower temperature as the processing time becomes longer. That is, the controller 100 sets the predetermined temperature to a lower temperature as the etching processing proceeds.

In the etching processing, the higher the temperature of the etching liquid, the greater the etching rate of the silicon nitride films 8A. When the etching processing proceeds with a great etching rate of the silicon nitride films 8A, the silicon oxide may be precipitated while the etching liquid containing the components of the etched and eluted silicon nitride films 8A is discharged to the outside of the substrate 8.

Thus, the controller 100 sets the predetermined temperature to a lower temperature as the etching processing proceeds.

The controller 100 outputs a temperature control signal such that the temperature of the detected etching liquid becomes the set predetermined temperature (S12). That is, the controller 100 outputs a temperature control signal such that the temperature of the etching liquid is lowered as the etching processing proceeds.

For example, the controller 100 outputs a signal for reducing the heating amount of the etching liquid by the first heater 52, and controls the temperature of the etching liquid by the first heater 52. In addition, the controller 100 controls the temperature of the etching liquid by replacing a part of the etching liquid. The controller 100 discharges a part of the etching liquid and outputs a signal for supplying the reserve liquid from the temperature control tank 46. In addition, the controller 100 outputs a signal for controlling the temperature of the reserve liquid by the second heater 62 in the case of discharging a part of the etching liquid.

Figure 5A:
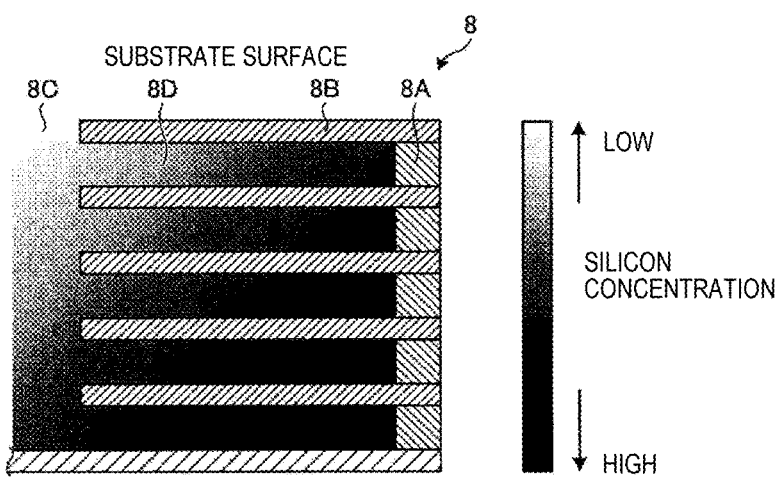
FIG. 5A is a map representing the silicon concentration in a substrate when the temperature of etching liquid is high.
Figure 5B:
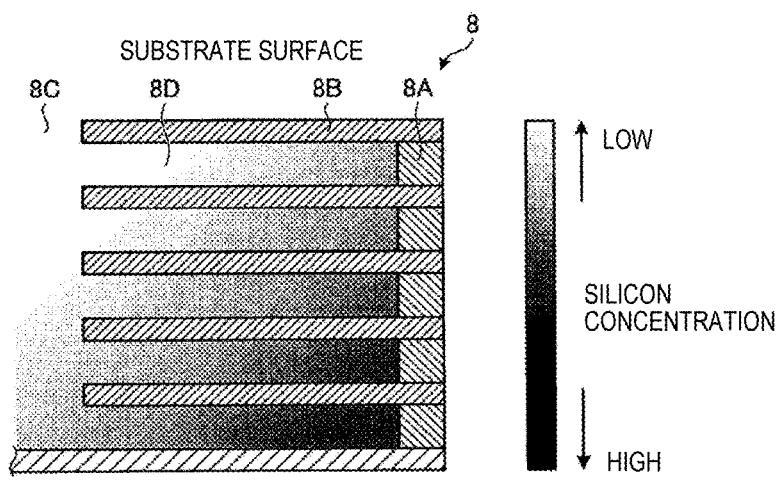
FIG. 5B is a map representing the silicon concentration in a substrate when the temperature of etching liquid is low.

Here, the silicon concentration in the case where the temperature of the etching liquid is lowered will be described with reference to FIGS. 5A and 5B. FIG. 5A is a map representing the silicon concentration in a substrate 8 when the temperature of etching liquid is high. FIG. 5B is a map representing the silicon concentration in a substrate 8 when the temperature of etching liquid is low. In addition, FIGS. 5A and 5B illustrate the same conditions except for the temperature of the etching liquid. FIGS. 5A and 5B illustrate that the darker the color, the higher the silicon concentration.

In the substrate 8 on which the etching processing is being performed, as the depth of the groove 8C of the substrate 8 becomes deeper, that is, the distance from the surface of the substrate 8 becomes longer, the silicon concentration becomes higher. In addition, as the distance from the groove 8C becomes longer, the silicon concentration in the gaps 8D formed between the silicon oxide films 8B becomes higher.

In addition, the silicon concentration when the temperature of the etching liquid becomes lower than the silicon concentration when the temperature of the etching liquid is high, and the silicon concentration may be lowered at a portion where the distance from the surface of the substrate 8 is long and the distance from the groove 8C is also long.

Thus, as the etching processing proceeds, the etching rate of the silicon nitride films 8A is reduced by lowering the temperature of the etching liquid. It is possible to suppress the increase in the silicon concentration in the etching liquid of the gaps 8D formed between the silicon oxide films 8B. Therefore, it is possible to suppress silicon oxide from being precipitated.

Figure 6:
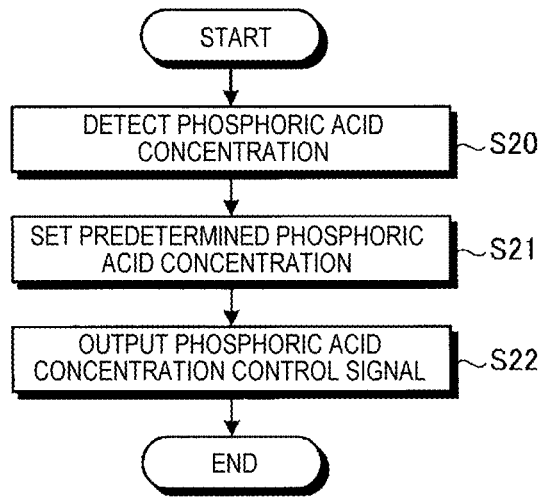
FIG. 6 is a flowchart for explaining a phosphoric acid concentration control in an etching processing.

Next, a phosphoric acid concentration control in an etching processing will be described with reference to FIG. 6. FIG. 6 is a flowchart for explaining a phosphoric acid concentration control in an etching processing.

When starting the etching processing, the phosphoric acid concentration of the etching liquid is a preset initial phosphoric acid concentration.

When starting the etching processing, the controller 100 detects the phosphoric acid concentration of the etching liquid using the phosphoric acid concentration sensor 81 (S20).

The controller 100 sets the phosphoric acid concentration of the etching liquid to a predetermined phosphoric acid concentration (S21). Specifically, the controller 100 sets a predetermined phosphoric acid concentration such that the etching liquid is maintained in a boiling state. For example, when lowering the temperature of the etching liquid by the above-described temperature control, the controller 100 sets the predetermined phosphoric acid concentration to a low concentration as the etching process proceeds in order to maintain the etching liquid in the boiling state.

It is also known that by lowering the phosphoric acid concentration of the etching liquid, the selection ratio of etching the silicon nitride films 8A relative to the silicon oxide films 8B increases.

Therefore, the controller 100 is capable of increasing the selection ratio by setting the predetermined phosphoric acid concentration to a low concentration as the etching process proceeds.

The controller 100 outputs a phosphoric acid concentration control signal such that the detected phosphoric acid concentration becomes the set predetermined phosphoric acid concentration (S22). For example, when lowering the phosphoric acid concentration, the controller 100 outputs a signal for discharging a part of the etching liquid. Further, the controller 100 outputs a signal for supplying pure water or a reserve liquid.

In this way, the phosphoric acid concentration of the etching solution is lowered as the etching processing proceeds. Thus, by maintaining the boiling state of the etching liquid and generating a liquid flow in the etching liquid, it is possible to suppress unevenness in etching of the substrate 8. In addition, it is possible to increase the selection ratio.

Here, lowering the phosphoric acid concentration is not indispensable, and the phosphoric acid concentration may be constant throughout the processing process. In addition, after reducing the phosphoric acid concentration to a certain concentration, the phosphoric acid concentration may be made constant.

Figure 7:
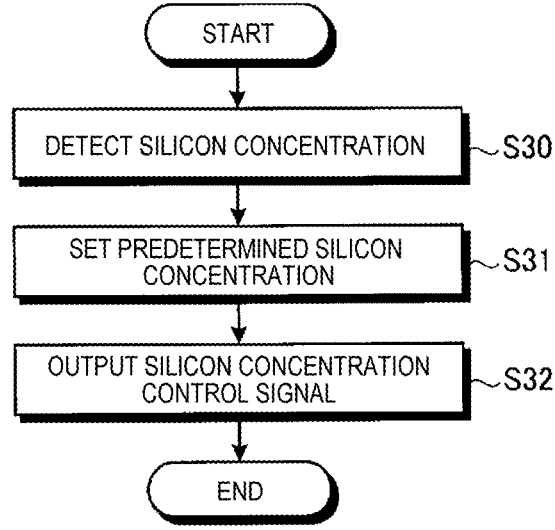
FIG. 7 is a flowchart for explaining a silicon concentration control in an etching processing.

Next, a silicon concentration control in the etching processing will be described with reference to FIG. 7. FIG. 7 is a flowchart for explaining a silicon concentration control in an etching processing.

When starting the etching processing, the silicon concentration of the etching liquid is a preset initial silicon concentration. Normally, when the silicon concentration is high, since the selection ratio becomes large, the initial silicon concentration is set to a concentration close to the saturation concentration.

When the etching processing is started, the controller 100 detects the silicon concentration of the etching liquid using the silicon concentration sensor 82 (S30).

Figure 8:
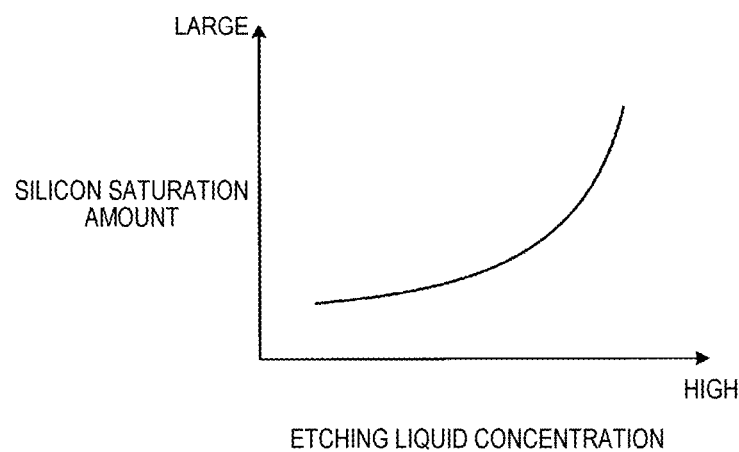
FIG. 8 is a map representing a relationship between the temperature of an etching liquid and the saturation amount of silicon.

The controller 100 sets the silicon concentration of the etching liquid to a predetermined silicon concentration (S31). Specifically, the controller 100 sets a predetermined silicon concentration based on the temperature of the etching liquid. As illustrated in FIG. 8, the saturation amount of silicon in the etching liquid is reduced as the temperature of the etching liquid is lowered. That is, when the temperature of the etching liquid is lowered, silicon oxide is likely to be precipitated. FIG. 8 is a map representing a relationship between the temperature of an etching liquid and the saturation amount of silicon.

Therefore, the controller 100 sets the predetermined silicon concentration to a concentration equal to or less than the saturation concentration corresponding to the saturation amount of silicon as the temperature of the etching liquid is lowered due to the above-described temperature control, that is, as the etching processing proceeds.

The controller 100 outputs a silicon concentration control signal such that the detected silicon concentration becomes the set silicon concentration (S32). In the etching processing, as the etching processing proceeds, the silicon nitride films 8A are etched and the silicon nitride films 8A are eluted into the etching liquid, and thus the silicon concentration of the etching liquid is increased as a whole. Thus, for example, when lowering the silicon concentration, the controller 100 outputs a signal for discharging a part of the etching liquid. Further, the controller 100 outputs a signal for supplying pure water or a reserve liquid.

As described above, as the etching processing proceeds, it is possible to suppress precipitation of silicon oxide by lowering the silicon concentration of the etching liquid.

When the silicon concentration of the etching liquid is not the saturation concentration, it is not necessary to control the silicon concentration until the silicon concentration reaches the saturation concentration. In this case, for example, when the detected silicon concentration reaches the saturation concentration based on the temperature of the etching liquid, the predetermined silicon concentration is set to the saturation concentration or less. That is, it is not essential to set the initial silicon concentration to a concentration close to the saturation concentration, and the initial silicon concentration may be zero, for example. By setting the initial silicon concentration low, it is possible to increase the time until the silicon concentration in the groove 8C reaches the saturation concentration, and it is possible to suppress the precipitation of silicon oxide. Further, by increasing the silicon concentration until the silicon concentration reaches the saturation concentration, it is possible to increase the selection ratio.

Figure 9:
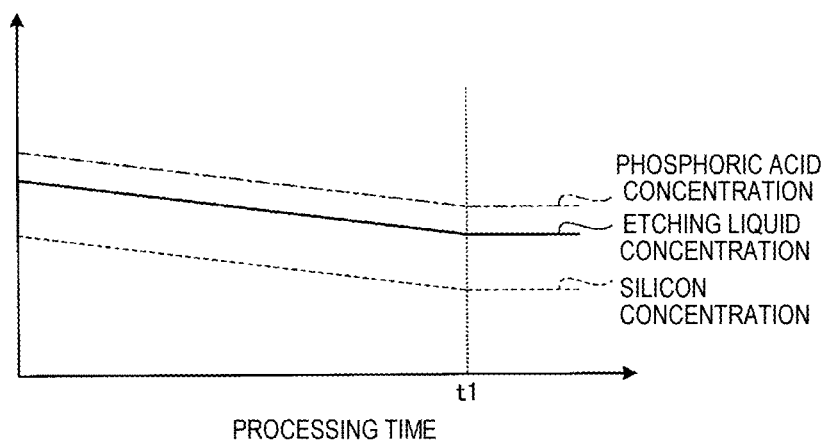
FIG. 9 is a view summarizing the temperature of an etching liquid, a phosphoric acid concentration, and a silicon concentration with respect to a processing time.

As described above, when the temperature control, the phosphoric acid concentration control, and the silicon concentration control are performed, the temperature of the etching liquid, the phosphoric acid concentration, and the silicon concentration are lowered according to the processing time as represented in FIG. 9. FIG. 9 is a view summarizing the temperature of an etching liquid, a phosphoric acid concentration, and a silicon concentration with respect to a processing time.

In the etching processing, as represented in FIG. 9, at time t1 at which the temperature control, the phosphoric acid concentration control, and the silicon concentration control are terminated and the etching is terminated, the temperature of the etching liquid is the processing termination temperature, the phosphoric acid concentration is the processing termination phosphoric acid concentration, and the silicon concentration is the processing termination silicon concentration. In the etching processing, after time t1, the substrate 8 is held for a predetermined period in the state of time t1, and overetching is performed. Thus, it is possible to suppress the occurrence of etching leakage of the silicon nitride films 8A on the substrate 8.

In addition, the temperature of the etching temperature, the phosphoric acid concentration, and the silicon concentration may not be continuous but may be changed stepwise. In addition, the timing at which the temperature of the etching liquid reaches the processing termination temperature, the timing at which the phosphoric acid concentration reaches the processing termination phosphoric acid concentration, and the timing at which the silicon concentration becomes the processing termination silicon concentration may be different timings.

The substrate processing apparatus 1 lowers the temperature of the etching liquid as the etching processing proceeds. Accordingly, the etching rate of the silicon nitride films 8A is reduced, so that, for example, the silicon concentration in the etching liquid in the gaps 8D formed between the silicon oxide films 8B can be suppressed from being locally increased. Therefore, it is possible to suppress the precipitation of silicon oxide.

The substrate processing apparatus 1 lowers the phosphoric acid concentration of the etching liquid as the etching processing proceeds. Thus, it is possible to maintain the boiling state of the etching liquid, suppress the occurrence of unevenness in the etching of the substrate 8, and increase the selection ratio.

The substrate processing apparatus 1 lowers the silicon concentration of the etching liquid as the etching processing proceeds. Therefore, it is possible to suppress the precipitation of silicon oxide.

The substrate processing apparatus 1 according to a modification may be configured to supply a reserve liquid from the temperature control tank 46 to the inner tank 44 by connecting the supply line 70 to the inner tank 44.

In addition, in the substrate processing apparatus 1 according to the modification, a precipitation inhibitor for $SiO_2$ may be supplied in order to suppress the precipitation of silicon oxide. As the precipitation inhibitor for $SiO_2$, any material may be used as long as it contains a component that stabilizes silicon ions dissolved in a phosphoric acid aqueous solution in the dissolved state and suppresses the precipitation of silicon oxide. For example, hexafluorosilicic acid ($H_2SiF_6$) aqueous solution may be used. In addition, in order to stabilize the hexafluorosilicic acid in the aqueous solution, an additive such as, for example, ammonia may be contained.

For example, the precipitation inhibitor for $SiO_2$ is, for example, ammonium hexafluorosilicate (($NH_4)_2SiF_6$) or sodium hexafluorosilicate ($Na_2SiF_6$).

In addition, the substrate processing apparatus 1 according to the modification may lower the temperature of the etching liquid, the phosphoric acid concentration, and the silicon concentration based on the elapsed time of the etching processing without using the temperature sensor 80, the phosphoric acid concentration sensor 81, and the silicon concentration sensor 82. For example, when the elapsed time of the etching processing reaches a preset time, the substrate processing apparatus 1 according to the modification lowers the temperature of the etching liquid, the phosphoric acid concentration, and the silicon concentration. In addition, the timing (elapsed time) for lowering the temperature of the etching liquid, the phosphoric acid concentration, and the silicon concentration may be set for each of the temperature of the etching liquid, the phosphoric acid concentration, and the silicon concentration.

Figure 10:
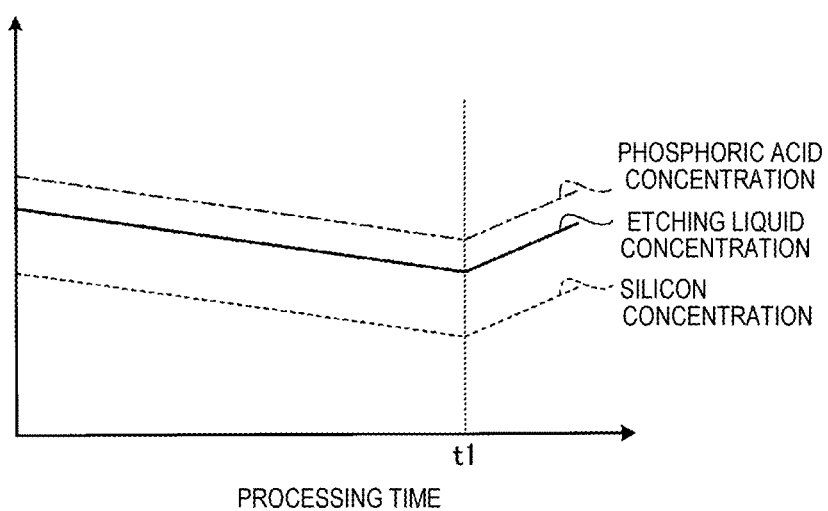
FIG. 10 is a view summarizing the temperature of an etching liquid, a phosphoric acid concentration, and a silicon concentration with respect to a processing time in a substrate processing apparatus according to a modification.

Further, as illustrated in FIG. 10, the substrate processing apparatus 1 according to the modification raises the temperature of the etching liquid, the phosphoric acid concentration, and the silicon concentration after time t1 at which the etching is terminated, that is, at the time of overetching. This is because elution of silicon nitride films 8A almost disappears during overetching. As a result, it is possible to shorten the time required for overetching, and thus it is possible to shorten the etching processing time. FIG. 10 is a view summarizing a temperature of an etching liquid, a phosphoric acid concentration, and a silicon concentration with respect to a processing time in the substrate processing apparatus 1 according to the modification.

In addition, the timing of raising the temperature of the etching liquid, the timing of increasing the phosphoric acid concentration, and the timing of increasing the silicon concentration may be different timings.

The substrate processing apparatus 1 is an apparatus for simultaneously processing a plurality of substrates 8, but may be a single wafer type apparatus for cleaning the substrates 8 one by one.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate processing tank configured to etch a substrate by immersing the substrate in a phosphoric acid processing liquid and including a first circulation line configured to circulate the phosphoric acid processing liquid in the substrate processing tank;
   a temperature control tank configured to receive the phosphoric acid processing liquid from a phosphoric acid aqueous solution supply and supply a reserve liquid to the substrate processing tank, the temperature control tank including a second circulation line, the second circulation line being configured to circulate the reserve liquid in the temperature control tank;
   a temperature adjuster configured to adjust a temperature of the phosphoric acid processing liquid, the temperature adjuster including a first heater positioned in the first circulation line and a second heater positioned in the second circulation line; and
   a controller configured to control the temperature adjuster to adjust the temperature of the phosphoric acid processing liquid in the substrate processing tank such that the substrate is etched with the phosphoric acid processing liquid having a pre-set initial temperature when starting to immerse the substrate in the phosphoric acid processing liquid, and subsequently as the substrate is being etched, adjusting the temperature of the phosphoric acid processing liquid to become lower than the pre-set initial temperature.

2. The substrate processing apparatus of claim 1, wherein the controller is configured to control the temperature adjuster to raise the temperature of the phosphoric acid processing liquid after lowering the temperature of the phosphoric acid processing liquid to a predetermined temperature.

3. The substrate processing apparatus of claim 1, further comprising:
   a phosphoric acid concentration adjuster configured to adjust a phosphoric acid concentration in the phosphoric acid processing liquid,
   wherein the controller is configured to control the phosphoric acid concentration adjuster to lower the phosphoric acid concentration as the etching processing proceeds.

4. The substrate processing apparatus of claim 3, wherein the controller is configured to control the phosphoric acid concentration adjuster to increase the phosphoric acid concentration after lowering the phosphoric acid concentration of the phosphoric acid processing liquid to a predetermined phosphoric acid concentration.

5. The substrate processing apparatus of claim 1, further comprising:
   a silicon concentration adjuster configured to adjust a silicon concentration in the phosphoric acid processing liquid,
   wherein the controller is configured to control the silicon concentration adjuster to lower the silicon concentration as the etching processing proceeds.

6. The substrate processing apparatus of claim 5, wherein the controller is configured to control the silicon concentration adjuster to increase the silicon concentration after lowering the silicon concentration of the phosphoric acid processing liquid to a predetermined silicon concentration.

7. The substrate processing apparatus of claim 1, wherein the temperature adjuster further includes a flow rate regulator.

8. The substrate processing apparatus of claim 7, wherein the flow rate regulator is configured to adjust a supply of pure water from a pure water source to the substrate processing tank.

9. The substrate processing apparatus of claim 7, wherein the flow rate regulator is configured to adjust a supply of the reserve liquid from the temperature control tank to the substrate processing tank.

10. The substrate processing apparatus of claim 7, wherein the first heater is configured to control a temperature of the phosphoric acid processing liquid supplied to an inner tank of the substrate processing tank from an outer tank of the substrate processing tank.

11. The substrate processing apparatus of claim 7, wherein the second heater is configured to control a temperature of the reserve liquid supplied to an outer tank of the substrate processing tank from the temperature control tank.

12. A substrate processing method comprising:
    first adjusting a temperature of a phosphoric acid processing liquid to a pre-set initial temperature;
    immersing a substrate in the phosphoric acid processing liquid contained in a substrate processing tank at the pre-set initial temperature such that the substrate is etched; and
    second adjusting the temperature of the phosphoric acid processing liquid to a temperature lower than the pre-set initial temperature via a temperature adjuster after the immersing as the substrate is being etched,
    wherein the temperature adjuster includes a first heater positioned in a first circulation line, the first circulation line being configured to circulate the phosphoric acid processing liquid in the substrate processing tank and a second heater positioned in a second circulation line, the second circulation line being configured to circulate a reserve fluid in a temperature control tank separate from the substrate processing tank, the temperature control tank being configured to supply the reserve fluid to the substrate processing tank and to receive phosphoric acid processing liquid from the phosphoric acid aqueous solution supply.

13. A non-transitory computer-readable storage medium that stores a program for causing a computer to execute the substrate processing method of claim 12.

* * * * *